(12) United States Patent
Pan et al.

(10) Patent No.: US 8,881,079 B1
(45) Date of Patent: Nov. 4, 2014

(54) DATAFLOW PARAMETER ESTIMATION FOR A DESIGN

(71) Applicant: Xilinx, Inc., San Jose, CA (US)

(72) Inventors: Peichen Pan, Campbell, CA (US);
Chang'an Ye, Beijing (CN); Kecheng Hao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/797,771

(22) Filed: Mar. 12, 2013

(51) Int. Cl.
*G06F 17/50* (2006.01)

(52) U.S. Cl.
CPC .................................. *G06F 17/5031* (2013.01)
USPC .......................................... 716/111; 716/104

(58) Field of Classification Search
CPC ................. G06F 17/50; G06F 9/455
USPC .................................................. 716/104, 111
See application file for complete search history.

(56) References Cited

U.S. PATENT DOCUMENTS

2012/0065956 A1* 3/2012 Irturk et al. ..................... 703/21

* cited by examiner

*Primary Examiner* — Thuan Do
(74) *Attorney, Agent, or Firm* — W. Eric Webostad

(57) ABSTRACT

An embodiment of a method of high-level synthesis of a dataflow pipeline is disclosed. This embodiment includes obtaining processes from the high-level synthesis of the dataflow pipeline. A schedule for read operations and write operations for first-in, first-out data channels of the processes is determined. A dataflow through the dataflow pipeline for the schedule is determined. An edge-weighted directed acyclic graph for the processes and the dataflow is generated. A longest path in the edge-weighted directed acyclic graph is located. A weight for the longest path is output as an estimate, such as a latency estimate for example, for the dataflow.

20 Claims, 9 Drawing Sheets

DATAFLOW PARAMETER ESTIMATION FOR A DESIGN

FIELD OF THE INVENTION

The following description relates to integrated circuit devices ("ICs"). More particularly, the following description relates to dataflow parameter estimation for a design for an IC.

BACKGROUND

A design may be described by using a hardware description language ("HDL"), such as Verilog or VHDL for example. However, using an HDL is more for circuit design, and many software engineers are not familiar with these types of languages and/or circuit design. Furthermore, as technology advances, applications and designs may be architected on a higher functional level than at the HDL level, such as using objects and classes for example. Along those lines, a high-level synthesis ("HLS") tool that uses a programming language, such as ANSI C, C++ and/or SystemC for example, may be used. An HLS tool may be used to translate an application or design specified in a programming language into an HDL circuit design.

An application or a design ("design") in a programming language may be synthesized by an HLS tool, and such synthesis may be used in order to better understand behavior of such design prior to manufacture. Latency is a significant Quality of Result ("QoR") metric used to evaluate quality of a design prior to manufacture.

Along those lines, an HLS tool that could be used to provide accurate latency estimation would be useful.

SUMMARY

A method relates generally to a method for high-level synthesis of a design. In such method, processes from the high-level synthesis of the design are obtained. A schedule for read operations and write operations for first-in, first-out data channels of the processes is determined. A dataflow through the high-level synthesis of the design for the schedule is determined. An edge-weighted directed acyclic graph is generated for the processes and the dataflow. A longest path in the edge-weighted directed acyclic graph is located. A weight for the longest path is output as an estimate for the dataflow.

Another method relates generally to a high-level synthesis of a design. In such method, processes from the high-level synthesis of the design are obtained. A schedule of read operations and write operations for first-in, first-out data channels of the processes is determined. A dataflow responsive to the schedule is determined. An edge-weighted directed acyclic graph for the processes and the dataflow is generated. A highest weighted path is located in the edge-weighted directed acyclic graph. A weight associated with the highest weighted path is output as an estimate. The estimate is for flow of data through the high-level synthesis of the design as represented by the edge-weighted directed acyclic graph.

A computer program product relates generally to estimating a parameter of a high-level synthesis design. Such computer program product includes a tangible computer-readable storage medium with a computer-readable program stored. The computer-readable program is capable of being processed by an information handling system for causing the information handling system to perform operations. These operations include obtaining processes from the high-level synthesis design. A schedule for read operations and write operations for first-in, first-out data channels is determined for the processes to be executed. A dataflow data structure is determined responsive to the schedule. An edge-weighted directed acyclic graph for the processes and the dataflow is generated. A highest weighted path is located in the edge-weighted directed acyclic graph generated. A weight associated with the highest weighted path of the edge-weighted directed acyclic graph is output as an estimate. The estimate is for flow of data through the high-level synthesis design as represented by the edge-weighted directed acyclic graph.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
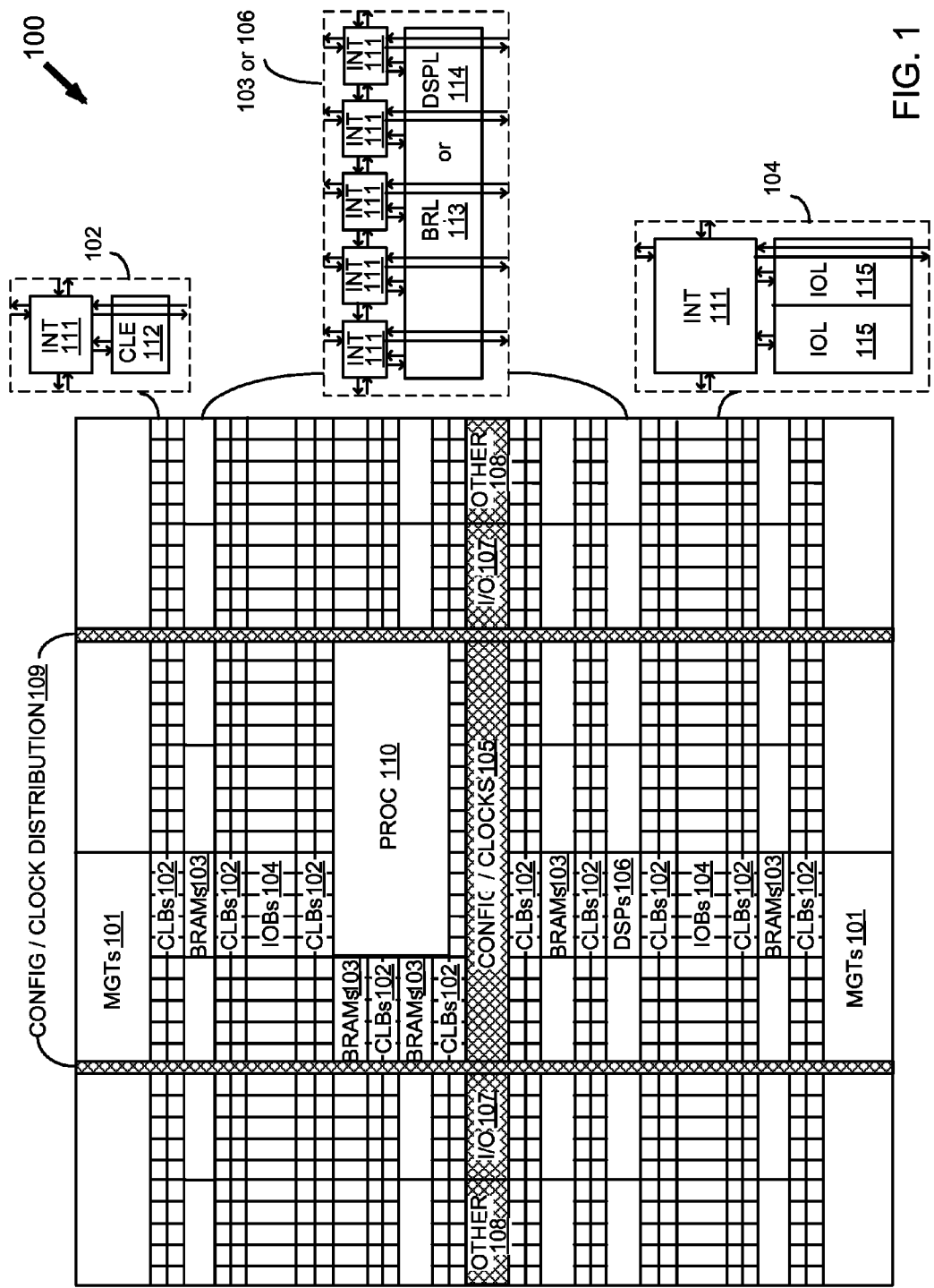
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Conventionally, latency estimation for an HLS design has not been very accurate due to an inability to account for parallel execution and/or stalls. As described below in additional detail, from an HLS design more accurate latency estimation may be determined by constructing and then using an edge-weighted directed acyclic graph ("DAG"). As described below in additional detail, such an edge-weighted DAG may take into account executing processes in parallel and/or stalling of one or more processes.

With the above general understanding borne in mind, various embodiments for a high-level synthesis are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
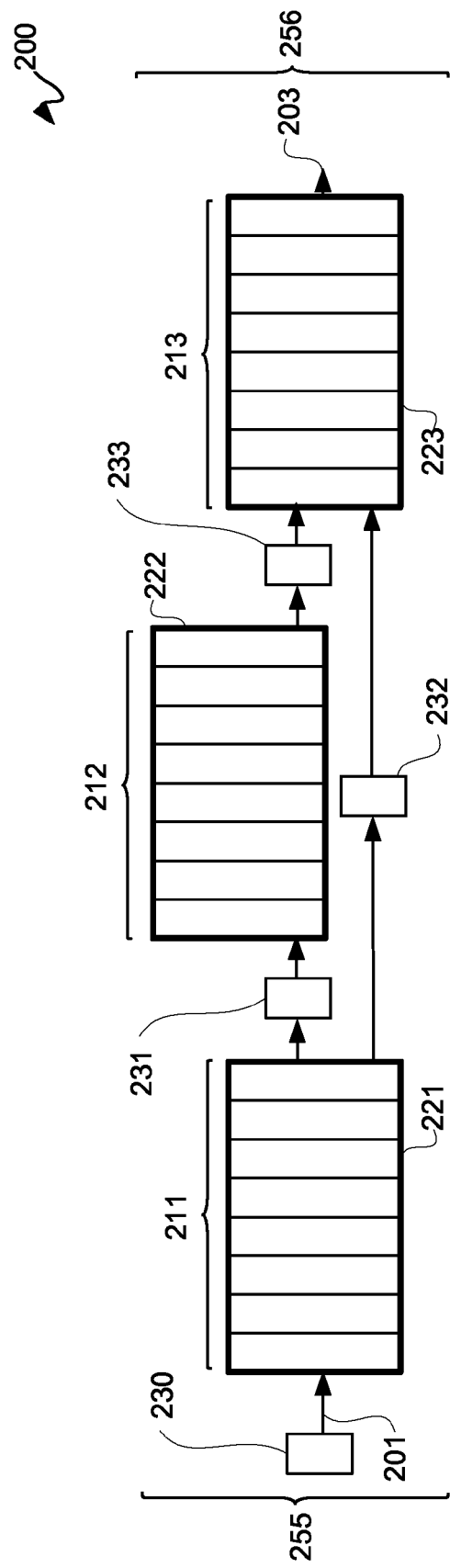
FIG. 2 is a block diagram depicting an exemplary dataflow pipeline.

FIG. 2 is a block diagram depicting an exemplary dataflow pipeline 200. By "dataflow pipeline", it is generally meant any circuit or combination of circuits where data flows through the circuit or circuits. While a classic pipeline with register stages may be a circuit or circuits within a dataflow pipeline, the term dataflow pipeline is broader than the classic definition of a pipeline. Moreover, such combination of circuits may or may not be coupled to one another. Such coupling of processes, such as generally indicated as processes 211 through 213, may be through first-in, first-out buffers ("FIFOs"), such as FIFOs 231 through 233. Optionally, a FIFO may be used to feed data pipeline 200, such as for example input FIFO 230. Along those lines, data pipeline 200 may optionally include an output FIFO (not shown). However, for purposes of clarity and not limitation, it shall be assumed that input FIFO 230 is present for reasons which shall become apparent.

Even though a dataflow pipeline 200 is illustratively depicted for purposes of clarity by way of example, it should be understood that any circuit, whether synchronous, asynchronous, or combination thereof (i.e., an asynchronous-synchronous circuit) may be used in accordance with the following description. Dataflow pipeline 200 may be instantiated using programmable resources, such as of FPGA 100 of FIG. 1. However, it should be appreciated from the following description that any HLS design, whether subsequently instantiated in dedicated hardware, programmable resources, or a combination thereof, may benefit from the following description.

Dataflow pipeline 200 may include multiple groups of process stages, such as for example groups of process stages ("stages") 221 through 223 of respective processes, namely respectively processes 211 through 213. Dataflow pipeline 200 may be a FIFO-based dataflow pipeline; meaning that dataflow with associated processes 211 through 213 may be controlled, including without limitation synchronized, via associated FIFO data channels. A data flow pipeline may have one or more input channels 255 and one or more output channels 256, as generally indicated.

Along those lines, a FIFO data channel as associated with one or two processes, such as any of processes 211 through 213, for example effectively means that such process has or processes have operations that are scheduled to take place at various stages. Accordingly, processes do not include FIFOs, rather processes have operations. These operations may occur at various stages of such processes as associated with cycles of a clock. Some of these operations may call for reading information, such as reading data for example from a FIFO, and others of these operations may call for writing information to a FIFO.

Each stage within such stages 221 through 223 may be associated therewith process operations of such associated processes 211 through 213. Data 201 may be input to one of stages 221 for process 211. In this example, data may be input to a stage of stages 221 of process 211 responsive to a call for a read operation in such stage, where such read is from input FIFO 230 for example. Data provided from stages 221 to either or both of stages 222 and 223 may be used in processes 212 and 213, respectively. Along those lines, there may be data dependencies associated with processes 212 and 213 due to process 211 having to process data 201 prior to processes 212 and/or 213. Likewise, process 212 may have to process data prior to process 213, and thus there may be a data dependency between such processes. However, more generally, namely with or without data dependencies, data input to processes 212 and 213 may be blocked by process 211.

If processes 211 through 213 are all started at generally the same time, such as all started simultaneously for example, processes 212 and 213 may be blocked until valid data from one or more FIFO data channels of process 211 is respectively provided to processes 212 and 213 via FIFOs 231 and 232, respectively, in this example.

From an HLS of dataflow pipeline 200, estimating latency of each of processes 211 through 213 in dataflow pipeline 200 and accumulating such latencies to provide an overall dataflow latency conventionally was not sufficiently accurate in the past. This inaccuracy may have resulted from a failure to account for parallelism between one or more processes, such as processes 211 through 213 for example, in a dataflow run in parallel. Additionally or separately, this inaccuracy may have resulted from a failure to account for stalls of one or more processes in a dataflow. For example, if an overflow condition occurs in a dataflow pipeline 200, if a stage in stages 222 is full, then a stage in stages 221 may be stalled from providing data to such stage in stages 222. Likewise, if an underflow condition occurs in a dataflow pipeline 200, for example if a stage in stages 222 is empty, then such an empty stage in stages 222 may have to wait upon getting more data from such stage in stages 221.

Data flow through dataflow pipeline 200, namely from input data 201 to output data 203, may have latencies associated therewith. In this example, each of stages 221 through 223 has eight stages associated with eight clock cycles for each of three processes, as previously described. Again, these may be one or more computation operations and/or other operations associated with FIFO data channels of processes 211 through 213, and not FIFOs themselves. In other dataflow pipelines, fewer or more numbers of stages may be used, and different groupings of stages may have different numbers of stages; for example, a grouping of stages 221 may have four stages and a grouping of stages 222 may have two stages. However, for purposes of clarity by way of example and not limitation, each of groupings of stages 221 through 223 shall be assumed have a same number of stages, namely eight stages in this example. Along those lines, each stage may be associated with a single clock cycle of a clock signal, not shown, to be generally consistent with a FIFO data channel.

One or more processes for estimating latency of an HLS circuit design described herein may be embodied in a computer program product, including without limitation a computer-aided engineering ("CAE") program or electronic design automation ("EDA") tool, which may be recorded or otherwise stored in a non-transitory machine-readable recording medium. Such computer-readable program may be capable of being processed by an information handling system for causing such system to perform operations as described herein.

Figure 3:
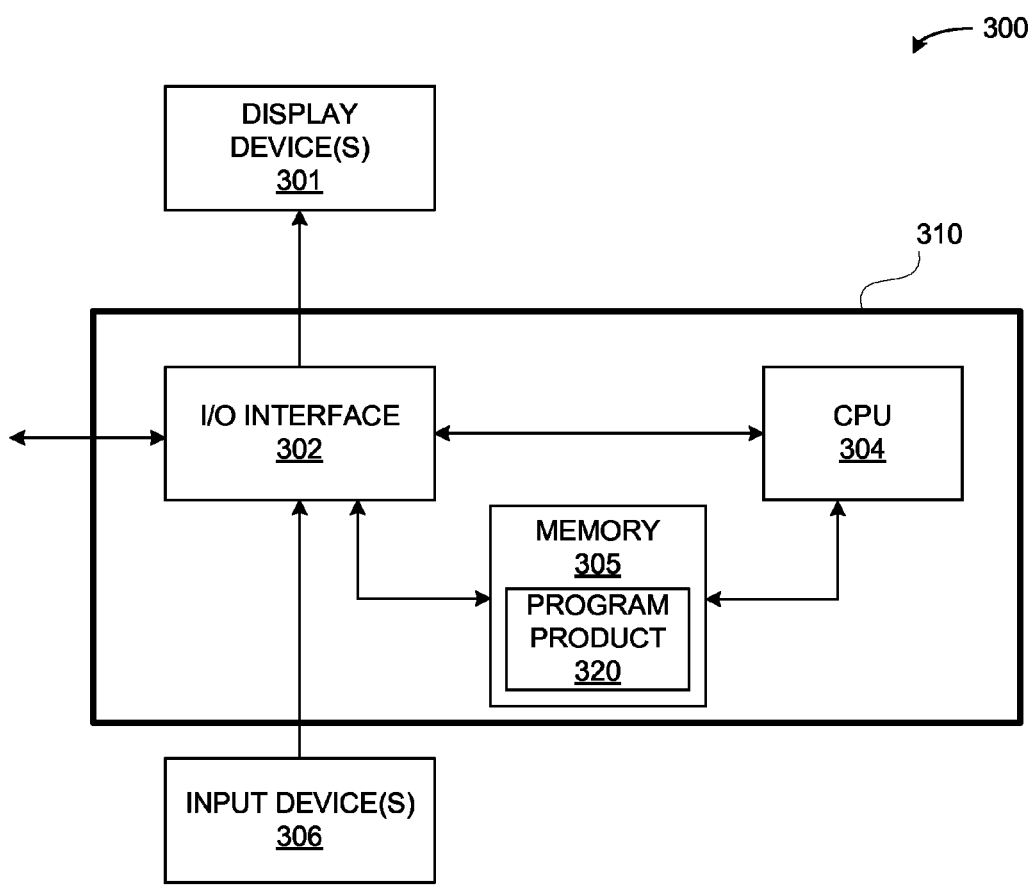
FIG. 3 is a block diagram depicting an exemplary computer system.

Along those lines, FIG. 3 is a block diagram depicting an exemplary computer system 300. Computer system 300 may include a programmed computer 310 coupled to one or more display devices 301, such as Cathode Ray Tube ("CRT") displays, plasma displays, Liquid Crystal Displays ("LCD"), projectors and to one or more input devices 306, such as a keyboard and a cursor pointing device. Other known configurations of a computer system may be used. Computer system 300 by itself or networked with one or more other computer systems 300 may provide an information handling system.

Programmed computer 310 may be programmed with a known operating system, which may be Mac OS, Java Virtual Machine, Real-Time OS Linux, Solaris, iOS, Android Linux-based OS, Unix, or a Windows operating system, among other known platforms. Programmed computer 310 includes a central processing unit (CPU) 304, memory 305, and an input/output ("I/O") interface 302. CPU 304 may be a type of microprocessor known in the art, such as available from IBM, Intel, ARM, and Advanced Micro Devices for example. Support circuits (not shown) may include cache, power supplies, clock circuits, data registers, and the like. Memory 305 may be directly coupled to CPU 304 or coupled through I/O interface 302. At least a portion of an operating system may be disposed in memory 305. Memory 305 may include one or more of the following: flash memory, random access memory, read only memory, magneto-resistive read/write memory, optical read/write memory, cache memory, magnetic read/write memory, and the like, as well as non-transitory signal-bearing media as described below.

I/O interface 302 may include chip set chips, graphics processors, and/or daughter cards, among other known circuits. An example of a daughter card may include a network interface card ("NIC"), a display interface card, a modem card, and a Universal Serial Bus ("USB") interface card, among other known circuits. Thus, I/O interface 302 may be coupled to a conventional keyboard, network, mouse, display printer, and interface circuitry adapted to receive and transmit data, such as data files and the like. Programmed computer 310 may be coupled to a number of client computers, server computers, or any combination thereof via a conventional network infrastructure, such as a company's Intranet and/or the Internet, for example, allowing distributed use for interface generation.

Memory 305 may store all or portions of one or more programs or data to implement processes in accordance with one or more embodiments hereof to provide program product 320. Additionally, those skilled in the art will appreciate that one or more embodiments hereof may be implemented in hardware, software, or a combination of hardware and software. Such implementations may include a number of processors or processor cores independently executing various programs and dedicated hardware or programmable hardware.

One or more program(s) of program product 320, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD). The above embodiments specifically include information downloaded from the Internet and other networks. Such non-transitory signal-bearing media, when carrying computer-readable instructions that direct functions hereof, represent embodiments hereof.

Figure 4:
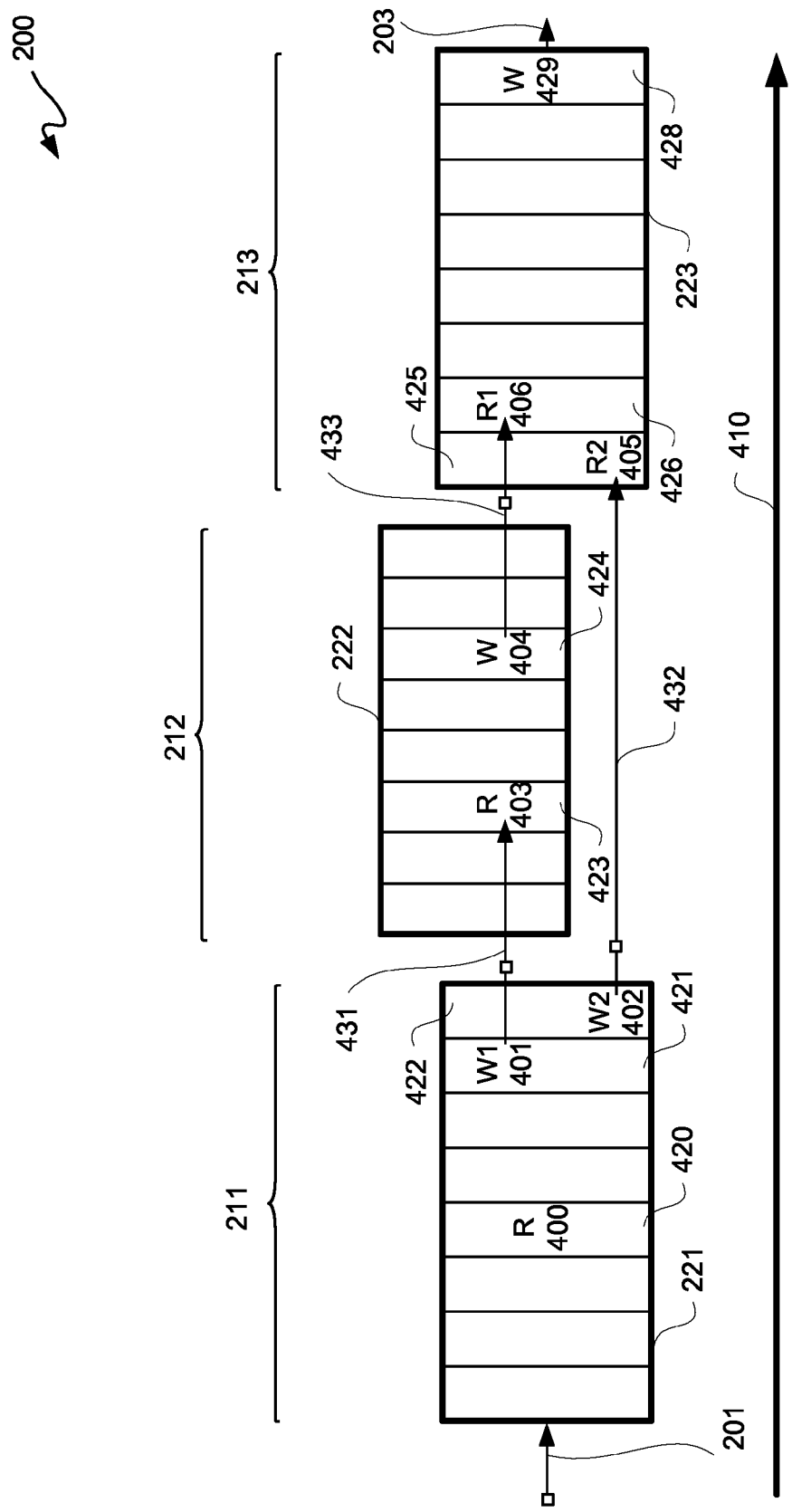
FIG. 4 is the block diagram of FIG. 2, where exemplary first-in, first-out ("FIFO") scheduled operations of processes of FIG. 2 are illustratively depicted.

FIG. 4 is generally the block diagram of FIG. 2, where exemplary FIFO scheduled operations of processes 211 through 213 are illustratively depicted. In FIG. 4, FIFOs 231 through 233 are generally represented with corresponding arrows 431 through 433. An optional input FIFO 230 of FIG. 2 may be assumed to be present, though not illustratively depicted in this figure. These are merely examples of scheduled operations of processes 211, 212, and 213 for purposes of clarity and not limitation. Again, it is assumed that all three processes 211 through 213 are started at the same time for three corresponding FIFO data channels of an HLS circuit design for a dataflow 410 from input data 201 to output data 203.

Again, even though synchronous processes are described for purposes of clarity by way of example, asynchronous processes or a combination of synchronous and asynchronous processes (i.e., an asynchronous-synchronous process) may be used. Along those lines, dataflow may be a synchronous flow of data, an asynchronous flow of data, or a combination thereof (i.e., an asynchronous-synchronous dataflow).

Input data 201 may be scheduled to be provided at a fourth stage 420 of stages 221 responsive to a read operation 400 in such stage of process 211. Such data may be scheduled to be read from an input FIFO 230 of FIG. 2 responsive to read operation 400. Read operation 400 shall be assumed to be scheduled to be at a fourth clock cycle from an initial start time of process 211 for a FIFO data channel thereof. Respectively at a seventh stage 421 and an eighth stage 422 of stages 221 of process 211, a write operation ("W1") 401 and a write operation ("W2") 402 may be scheduled to be performed. Along those lines, scheduled write operations 401 and 402 respectively have a three clock cycle and a four clock cycle latency with respect to scheduled read operation 400 of process 211.

Data may be scheduled to be written to FIFO 431 responsive to write operation 401 at stage 421 of stages 221 of process 211, and such data may be scheduled to be read from FIFO 431 responsive to a corresponding read operation 403 at a third stage 423 of stages 222 for a FIFO data channel of process 212. In a sixth stage 424 of stages 222 of process 212, a write operation 404 may be scheduled to be performed for process 212 to write data to FIFO 433, and such data may be scheduled to be read from FIFO 433 responsive to a read operation ("R1") 406 scheduled for a second stage 426 of stages 223 of process 213.

Data, scheduled to be written to FIFO 432 responsive to write operation 402 at an eighth stage 422 of process 211, may be scheduled to be read responsive to a read operation ("R2") 405 at a first stage 425 of process 213. Output data 203 may be scheduled to be written out from a FIFO data channel of process 213 at an eighth stage 428 responsive to a scheduled write operation 429 in such stage.

Accordingly, even though a relatively simple example of a dataflow pipeline 200 is illustratively depicted, it should be understood that determining an accurate latency estimate of dataflow through an HLS design may be difficult due to stalls introduced in one or more FIFO data channels, complex circuit topology which may include one or more data dependencies, and/or execution of one or more processes in parallel.

Figure 5:
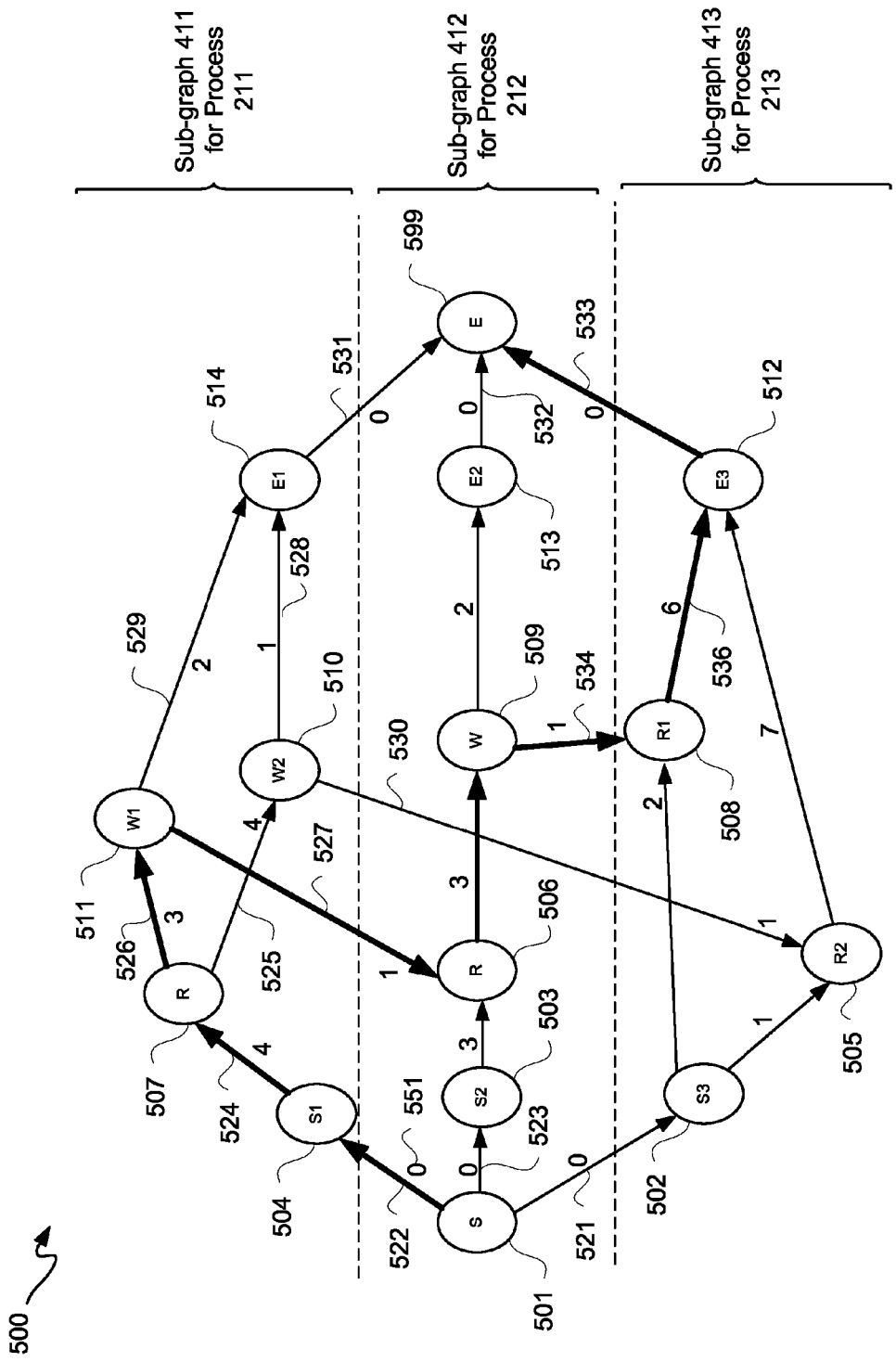
FIG. 5 is a network or nodal graph diagram depicting an exemplary edge-weighted directed acyclic graph ("DAG").

FIG. 5 is a network or nodal graph diagram depicting an exemplary edge-weighted directed acyclic graph ("DAG") 500. Edge-weighted DAG 500 is for processes 211 through 213 and dataflow 410 of FIG. 4. Processes 211 through 213 may be executed to run in parallel. In this example, processes 211 through 213 are synchronized by corresponding FIFO data channels to run in parallel as long as there is no blocking situations happening in the associated channels.

Figure 6:
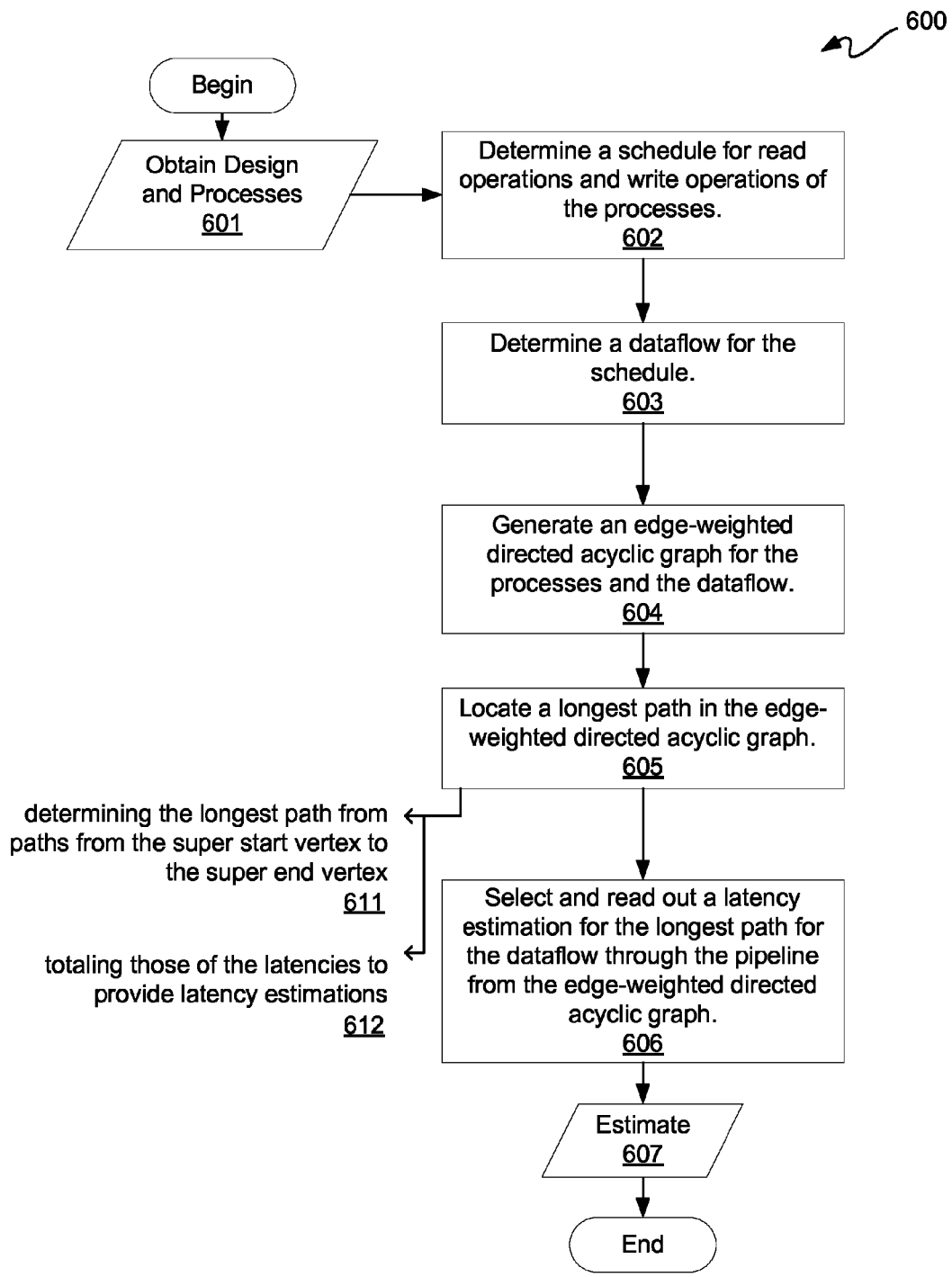
FIG. 6 is a flow diagram depicting an exemplary latency estimation process.

FIG. 6 is a flow diagram depicting an exemplary latency estimation process 600. Edge-weighted DAG 500 and latency estimation process 600 are concurrently described with simultaneous reference to FIGS. 4 through 6.

At 601, an HLS design, such as for example an HLS circuit design, is obtained or accessed and processes, such as processes 211 through 213 for example, are obtained for such an HLS design, such as for a dataflow pipeline 200 for example. Again, even though a dataflow pipeline 200 is used for purposes of clarity, any HLS circuit design may be used.

Figure 7:
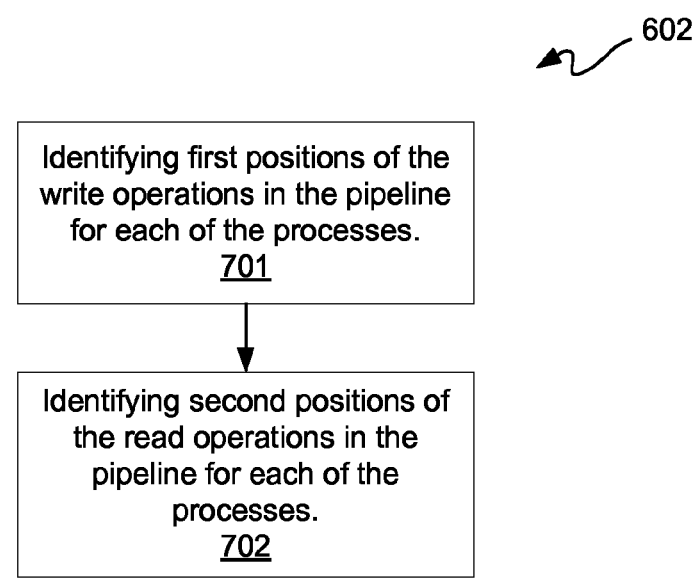
FIG. 7 is a flow diagram depicting an exemplary schedule determination flow.

At 602, a schedule may be determined for read operations and write operations of such processes obtained at 601. Such scheduling of read and write operations at various stages of such processes obtained at 601 may indicate latencies between such operations. With reference to FIG. 7, there is shown a flow diagram depicting an exemplary schedule determination flow 602; at 701, positions associated with write operations in a dataflow pipeline, such as dataflow pipeline 200 for example, may be identified for each process in such dataflow pipeline, such as processes 211 through 213 for example. At 702, positions associated with read operations in such a dataflow pipeline may be identified for each such process in such dataflow pipeline. Such positions identified at 701 and 702 may be from an input data channel or an output data channel of dataflow pipeline 200.

Along those lines, operations 400, 401, and 402 for process 211 may be associated, such as put in a table or other data structure, with associated clock cycles or stages at which such operations are scheduled to occur in dataflow pipeline 200. Operations 403 and 404 of process 212 may be associated with clock cycles or stages at which such operations are scheduled to occur in dataflow pipeline 200. Lastly, operations 405 and 406 of process 213 may be associated with clock cycles or stages at which such operations are scheduled to occur in dataflow pipeline 200.

At 603, a dataflow may be determined for a schedule determined at 602. Along those lines, dataflow from one operation to another operation may indicate direction of data, namely a sequence of operations. In other words, related operations may be associated with one another, where output of one operation feeds input of another operation. Thus, for example, a write of data schedule in one process may be associated with a corresponding read of such data in another process, where such processes are interconnected by a FIFO, and where such write is scheduled to write data to such FIFO, and such read is scheduled to read such data from such FIFO. Furthermore, it may be determined whether an operation is an initial or ending operation of a process, and such determination may be part of a data structure associated with a dataflow data structure having schedule information, as previously described.

Figure 8:
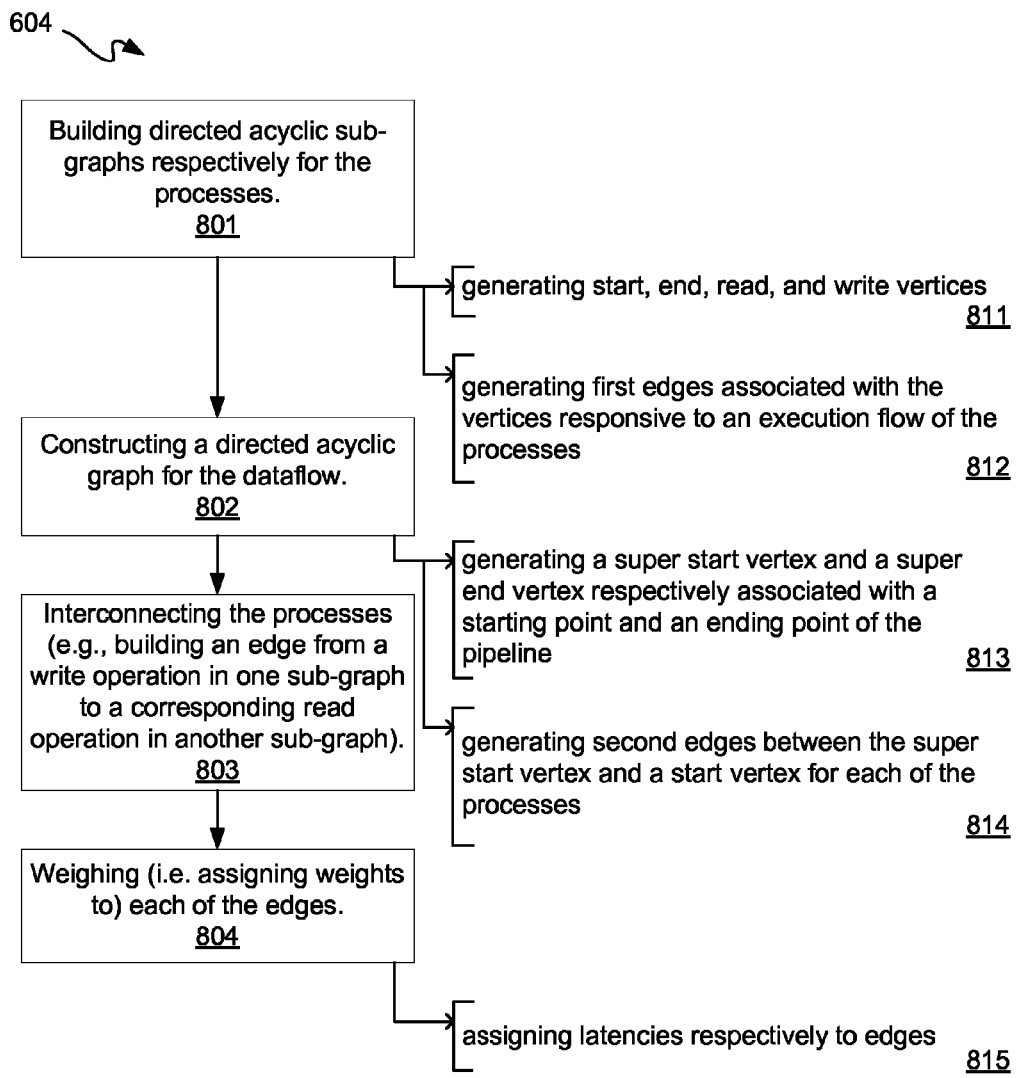
FIG. 8 is a flow diagram depicting an exemplary edge-weighted DAG generation flow.

At 604, an edge-weighted DAG, such as edge-weighted DAG 500 for example, may be generated for processes obtained at 601 and a dataflow determined at 603 for a schedule determined at 602. With reference to FIG. 8, there is shown a flow diagram depicting an exemplary edge-weighted DAG generation flow 604. At 801 directed acyclic sub-graphs, such as directed acyclic sub-graphs 411 through 413 for example, may be built for each process obtained at 201, such as respectively for processes 211 through 213 for example. Such building at 801 may include generating start, and, read and write vertices at 811, and such building may further include generating edges at 812 associated with such vertices generated at 811, where such edges generated at 812 are responsive to an execution flow of such processes. Effectively, a DAG 500 for dataflow 400 may be constructed on top of directed acyclic sub-graphs 411 through 413 respectively for processes 211 through 213.

For example, for sub-graph 411 for process 211, a start vertex ("S1") 504, a read vertex 507 vertex, a write vertex 510, a write vertex 511, and an end vertex ("E1") 514 are generated. Start vertex 504 indicates a beginning of process 211, and end vertex 514 indicates an end of process 211. Vertices 507, 510, and 511, corresponding to read and write operations of process 211, may be obtained from a dataflow determined at 603. An edge or vector 524 from a starting vertex 504 to read vertex 507 may be generated indicating a start of an execution flow of process 211 to a first operation of such process. Likewise, other edges associated with an execution flow from vertex to vertex associated with operations of process 211 may be constructed, namely an edge 525 from read vertex 507 to write vertex 510, an edge 526 from read vertex 507 to write vertex 511, an edge 528 from write vertex 510 to end vertex 514, and an edge 529 from write vertex 511 to end vertex 514.

Likewise, for sub-graph 412 for process 212, a start vertex ("S2") 503, a read vertex 506, a write vertex 509, and an end vertex ("E2") 513 are generated for read and write operations, as well as starting and ending, of such process. Additionally, edges interconnecting such vertices may be generated in an execution order for process 212.

Lastly, for sub-graph 413 for process 213, a start vertex ("S3") 502, a read vertex 505 vertex, a read vertex 508, and an end vertex ("E3") 512 are generated for read and write operations, as well as starting and ending, of such process. Additionally, edges interconnecting such vertices may be generated in an execution order for process 213.

At 802, a DAG may be constructed for a dataflow having directed acyclic sub-graphs built at 801. Along those lines, at 813 super start vertex, such as super start vertex 501, and a super end vertex, such as super end vertex 599, respectively associated with a starting point and an ending point of dataflow 410 may be generated. Super start vertex 501 and super end vertex 599 are used to concatenate each of the processes to unified starting and ending locations, respectively, for purposes of construction of a DAG, such as DAG 500 for example. This unification allows an overall latency among all processes, whether one process feeds another or not, to be determined, as described below in additional detail.

Additionally at 802, edges from a super start vertex to each sub-graph starting vertex are generated. For example, at 814 edges 521, 522, and 523 from super start vertex 501 respectively to start vertices 502, 504, and 503 may be generated. Furthermore, at 802, edges from each sub-graph ending vertex to a super end vertex are generated. For example, at 814 edges 531, 532, and 533 respectively from end vertices 514, 513, and 512 to super end vertex 599 are generated.

At 803, edges between processes, or more particularly between sub-graphs, are built to interconnect such processes. Such edges may be from write operations to corresponding read operations. As previously indicated, process 211 provides data to both of processes 212 and 213, and process 212 provides data to process 213. Accordingly, inter-process or inter-sub-graph edges may be generated at 803. Along those lines, edge 527 goes from write vertex 511 of sub-graph 411 for process 211 to read vertex 506 of sub-graph 412 for process 212, and edge 530 goes from write vertex 510 of sub-graph 411 for process 211 to read vertex 505 of sub-graph 413 for process 213. Furthermore, edge 534 goes from write vertex 509 of sub-graph 412 for process 212 to read vertex 508 of sub-graph 413 for process 213.

At 804, weights may be respectively assigned to edges of a DAG in order to provide an edge-weighted DAG, such as edge-weighted DAG 500 for example. Along those lines, at 815 latencies may be respectively assigned to edges. For edges 521 through 523, namely each edge between super start vertex 501 and a start vertex, a latency value of zero is assigned. Moreover, for edges 531 through 533, namely each edge between super end vertex 599 and an end vertex, a latency value of zero is assigned. Other latency values may be obtained from a dataflow data structure determined at 603 by taking a difference in cycle times between write operations and corresponding read operations. Additionally, with respect to an initial operation of a process or a final operation of a process, latency from a start vertex to such initial operation and latency from such final operation to an end vertex may be respectively assigned.

For example, from start vertex 504 to read vertex 507, where read vertex 507 is associated with read operation 400 of process 211 and where read operation 400 occurs four clock cycles into a FIFO data channel associated with stages 221 of process 221, namely at a fourth stage 420 of process 221, a four clock cycle latency, namely a value or weight of four may be assigned to edge 524. Likewise, there is a four clock cycle latency between read operation 400 associated with vertex 507 and write operation 402 associated vertex 510, and accordingly a weight of four may be assigned to edge 525. Furthermore, from write operation 402 associated with vertex 510 to read operation 405 associated with vertex 505, there is a one clock cycle latency going from an eighth stage 422 of stages 221 to a first stage 425 of stages 223, and so a weight of one may be assigned to edge 530. Moreover, from read vertex 508 associated with read operation 406 at second stage 426 of stages 223 to outputting output data 203 from an eighth stage 428 of FIFO 453, there is a six clock cycle latency, and so a weight of six may be assigned to edge 536. These are just some examples, and accordingly each edge of a DAG may be assigned a weight to provide an edge-weighted DAG, such as edge-weighted DAG 500 for example.

At 605, a most or highest weighted path, which in this example is a longest latency path, may be located in an edge-weighted DAG generated at 604. For example, at 611, each data path from super start vertex 501 to super end vertex 599 may have an estimated latency determined therefor in order to locate a longest estimated latency among all such data paths. Along those lines, at 612 weights assigned to edges may be totaled on a path-by-path basis to identify a total or overall latency for each possible path of data through a dataflow pipeline 200, namely all possible data paths of dataflow 410. Rather than a path-by-path basis, a more efficient known algorithm may be used to determine a longest path. For edge-weighted DAG 500, a longest latency path 550 for this example is generally identified with thick black lines.

At 606, a latency estimate 607 for a longest latency path of an edge-weighted DAG such as longest latency path 550 for example, for a dataflow, such as dataflow 410 through dataflow pipeline 200, may be selected and read out or output.

Figure 9:
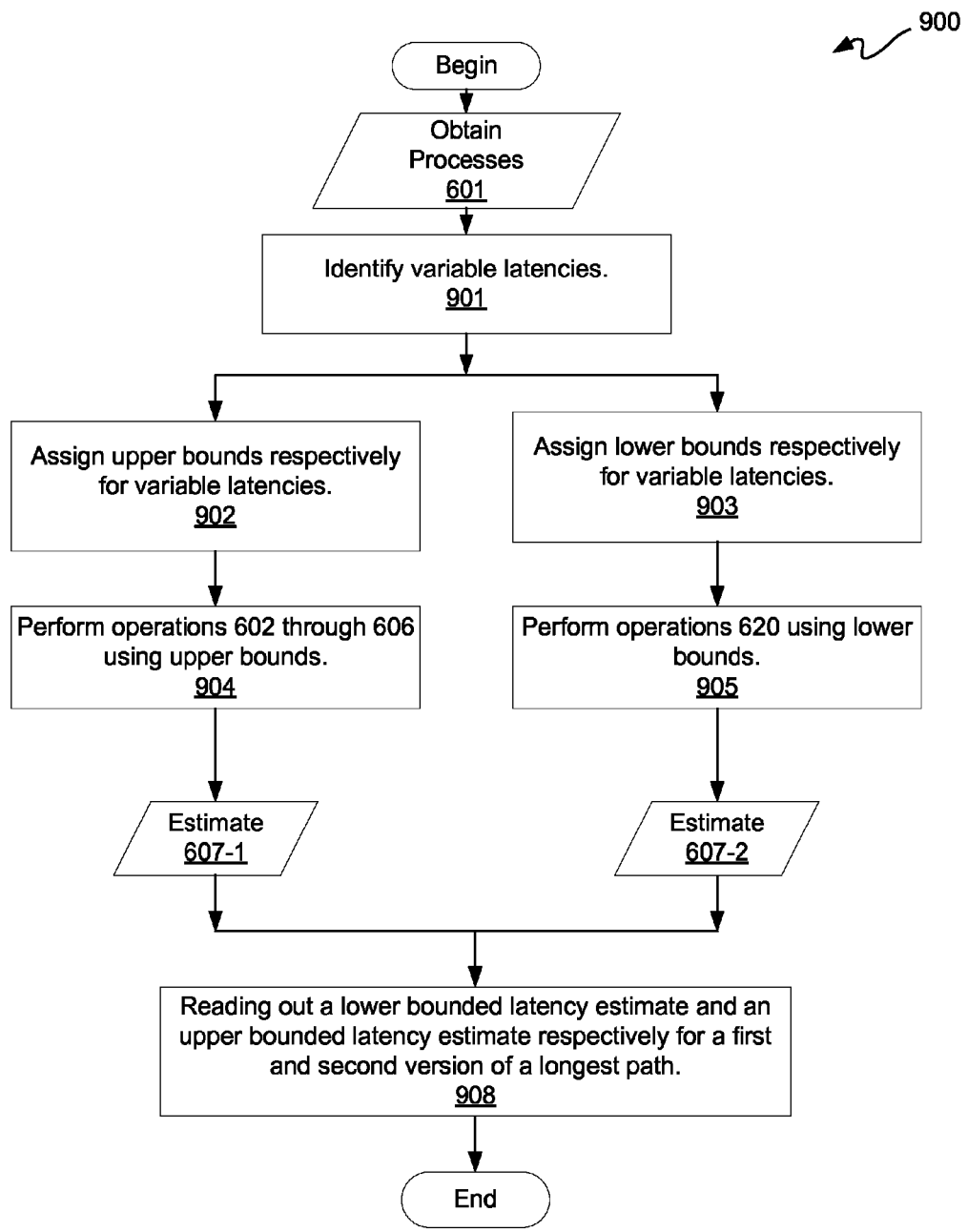
FIG. 9 is a flow diagram depicting an exemplary variable latency estimation process.

Latencies for a process may be static or dynamic, and so one or more edges in a DAG may be associated with variable or data-dependent latencies. Data dependencies are well-known, and thus are not described in unnecessary detail herein FIG. 9 is a flow diagram depicting an exemplary variable latency estimation process 900. At 601, processes are obtained, as previously described, and thus such description is not repeated for purposes of clarity. From such processes obtained at 601, any and all variable clock cycle latencies are identified at 901. At 902, upper bounds may be respectively assigned to each of such variable latencies identified at 901. At 904, operations 602 through 606 may be repeated using such upper bounds assigned at 902 to provide a longest latency estimate 607-1 for an upper-bounded edge-weighted DAG.

In parallel or separately from processing using upper bounds, at 903, lower bounds may be respectively assigned to each of such variable latencies identified at 901. At 905, operations 602 through 606 may be repeated using such lower bounds assigned at 903 to provide a longest latency estimate 607-2 for a lower-bounded edge-weighted DAG. Along those lines, it should be understood that a version of a longest latency path, namely a path with the greatest latency, through a lower-bounded edge-weighted DAG constructed at 905 may or may not use all the same vertices as an upper-bounded edge-weighted DAG constructed at 904. Thus, there may be a first and a second version of a longest latency path from a super start vertex to a super end vertex, which respective versions may or may not use all the same vertices and may or may not have a same latency estimates.

At 908, a lower bounded latency estimate and an upper bounded latency estimate respectively for a first upper bounded version and second lower bounded version of a longest latency path may be read out or otherwise output. Again, such lower bounded latency estimate and upper bounded latency estimate may or may not be different values.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method, comprising:
    obtaining processes of a high-level synthesis design of a dataflow pipeline by a programmed computer;
    determining a schedule for read operations and write operations for first-in, first-out data channels of the processes;
    determining a dataflow through the dataflow pipeline for the schedule;
    generating an edge-weighted directed acyclic graph for the processes and the dataflow;
    locating a longest path in the edge-weighted directed acyclic graph; and
    outputting a weight of the longest path as a latency estimate for the dataflow;
    wherein the generating comprises:
        constructing a directed acyclic graph for the dataflow;
        interconnecting the processes from first operations of the write operations to second operations of the read operations corresponding thereto; and
        assigning weights to each of the edges.

2. The method according to claim 1, wherein the determining of the schedule comprises:
    identifying first positions of the write operations in the dataflow pipeline for the first-in, first-out data channels of the processes; and
    identifying second positions of the read operations in the dataflow pipeline for each of the first-in, first-out data channels of the processes.

3. The method according to claim 2, wherein the identifying of the first positions and the identifying of the second positions are in an input channel and an output channel of the dataflow pipeline.

4. The method according to claim 1, wherein the write operations and the read operations are for writing data to and reading data from first-in, first-out buffers interconnecting the processes.

5. The method according to claim 4, wherein the processes are all run in parallel.

6. The method according to claim 4, wherein the processes are synchronized by the first-in, first-out data channels to run in parallel.

7. The method according to claim 1, wherein the processes includes at least one stall state in the dataflow.

8. The method according to claim 1, wherein the generating further comprises
    building directed acyclic sub-graphs respectively for the processes.

9. The method according to claim 8, wherein the assigning of weights comprises assigning latencies respectively to the edges.

10. The method according to claim 8, wherein the building of the directed acyclic sub-graphs comprises:
    generating start, end, read, and write vertices; and
    generating a first portion of the edges associated with the vertices responsive to an execution flow of each of the processes.

11. The method according to claim 10, wherein the constructing of the directed acyclic graph comprises:
generating a super start vertex and a super end vertex respectively associated with a starting point and an ending point of the dataflow;
generating a second portion of the edges as associated with being between the super start vertex and a start vertex for each of the processes; and
generating a third portion of the edges as associated with being between an end vertex for each of the processes and the super end vertex;
wherein the directed acyclic graph for the dataflow is constructed on top of the directed acyclic sub-graphs for the processes.

12. The method according to claim 11, wherein the interconnecting of the processes comprises generating a fourth portion of the edges as associated with being between the directed acyclic sub-graphs for the processes.

13. The method according to claim 12, wherein the locating of the longest path comprises determining the longest path through the edge-weighted directed acyclic graph from the super start vertex to the super end vertex.

14. The method according to claim 13, wherein:
the processes have variable latencies; and
the locating of the longest path comprises:
assigning lower bounds respectively for the variable latencies as part of the assigning of the weights to each of the edges;
determining a first version of the longest path for a first version of the edge-weighted directed acyclic graph from the paths from the super start vertex to the super end vertex with the lower bounds;
assigning upper bounds respectively for the variable latencies as part of the assigning of the weights to each of the edges; and
determining a second version of the longest path for a second version of the edge-weighted directed acyclic graph from the paths from the super start vertex to the super end vertex with the upper bounds.

15. The method according to claim 14, wherein the outputting of the weight comprises providing a lower bounded weight and an upper bounded weight as separate latency estimates for the latency estimate respectively for the first version and the second version of the longest path.

16. A computer aided design program recorded in a non-transitory machine-readable recording medium which performs the method according to claim 1.

17. A method, comprising:
obtaining processes from a high-level synthesis of a design by a programmed computer;
determining a schedule of read operations and write operations for first-in, first-out data channels of the processes;
determining a dataflow responsive to the schedule;
generating an edge-weighted directed acyclic graph for the processes and the dataflow;
locating a highest weighted path in the edge-weighted directed acyclic graph generated; and
outputting a weight associated with the highest weighted path as a latency estimate;
wherein the latency estimate is for flow of data through the high-level synthesis of the design as represented by the edge-weighted directed acyclic graph;
wherein the generating comprises:
constructing a directed acyclic graph for the dataflow;
interconnecting the processes from first operations of the write operations to second operations of the read operations corresponding thereto; and
assigning weights to each of the edges.

18. The method according to claim 17, wherein the processes are selected from a group consisting of a synchronous process, an asynchronous process, and an asynchronous-synchronous process.

19. A computer program product for estimating a parameter of a high-level synthesis design, the computer program product comprising:
a tangible computer-readable storage medium; and
a computer-readable program stored on the tangible computer-readable storage medium;
wherein the computer-readable program is capable of being processed by an information handling system for causing the information handling system to perform operations including:
obtaining processes from the high-level synthesis design recorded in the tangible computer-readable storage medium;
determining a schedule of read operations and write operations for first-in, first-out data channels of the processes to be executed;
determining a dataflow data structure responsive to the schedule;
generating an edge-weighted directed acyclic graph for the processes and the dataflow;
locating a highest weighted path in the edge-weighted directed acyclic graph generated; and
outputting a weight associated with the highest weighted path of the edge-weighted directed acyclic graph as a latency estimate
wherein the latency estimate is for flow of data through the high-level synthesis design as represented by the edge-weighted directed acyclic graph; wherein the generating comprises:
constructing a directed acyclic graph for the dataflow;
interconnecting the processes from first operations of the write operations to second operations of the read operations corresponding thereto; and
assigning weights to each of the edges.

20. The computer program product according to claim 19, wherein the outputting of the weight comprises providing a lower bounded latency estimate and an upper bounded latency estimate for the latency estimate respectively for a first version and a second version of the highest weighted path.

* * * * *